United States Patent
Fan

(10) Patent No.: US 9,510,465 B2
(45) Date of Patent: Nov. 29, 2016

(54) ELECTRONIC ALBUM

(71) Applicant: Shuyin Fan, Shenzhen (CN)

(72) Inventor: Shuyin Fan, Shenzhen (CN)

( * ) Notice: Subject to any disclaimer, the term of this patent is extended or adjusted under 35 U.S.C. 154(b) by 56 days.

(21) Appl. No.: 14/650,662

(22) PCT Filed: Sep. 18, 2013

(86) PCT No.: PCT/CN2013/083742
§ 371 (c)(1),
(2) Date: Jun. 9, 2015

(87) PCT Pub. No.: WO2015/035662
PCT Pub. Date: Mar. 19, 2015

(65) Prior Publication Data
US 2016/0242300 A1     Aug. 18, 2016

(30) Foreign Application Priority Data
Sep. 16, 2013   (CN) .......................... 2013 1 0423391

(51) Int. Cl.
| | |
|---|---|
| *G06F 1/16* | (2006.01) |
| *H05K 5/00* | (2006.01) |
| *A47G 1/14* | (2006.01) |
| *H04N 1/21* | (2006.01) |
| *H05K 5/02* | (2006.01) |

(52) U.S. Cl.
CPC ............... *H05K 5/0017* (2013.01); *A47G 1/14* (2013.01); *G06F 1/16* (2013.01); *H04N 1/2104* (2013.01); *H05K 5/0217* (2013.01)

(58) Field of Classification Search
CPC ....... A24F 15/12; G01S 7/032; A47B 88/04; G06F 1/16
USPC ....... 439/660, 188, 245, 404, 535, 289, 544; 361/681, 752, 679.21, 679.43, 679.06, 361/679.33; 206/250, 264, 242; 345/520, 345/82, 1.3; 248/157, 617, 49, 917, 548, 248/542, 149, 342, 278.1, 615, 688, 183.2, 248/397, 343; 312/319.8, 140, 319.5
See application file for complete search history.

(56) References Cited

U.S. PATENT DOCUMENTS

| | | | |
|---|---|---|---|
| 5,533,290 A | 7/1996 | Lee et al. | |
| 6,396,472 B1 | 5/2002 | Jacklin | |
| 2008/0062038 A1* | 3/2008 | Ouchi | G01S 7/032 342/175 |
| 2014/0352810 A1* | 12/2014 | Wedi | E03F 5/04 137/362 |
| 2015/0013991 A1* | 1/2015 | Angman | E21B 17/07 166/373 |
| 2015/0245655 A1* | 9/2015 | Memari | A24F 15/12 206/242 |

FOREIGN PATENT DOCUMENTS

| | | |
|---|---|---|
| CN | 200947141 Y | 9/2007 |
| CN | 201315123 Y | 9/2009 |
| CN | 101596086 A | 12/2009 |
| CN | 202262717 U | 6/2012 |
| CN | 103079127 A | 5/2013 |
| CN | 203057378 U | 7/2013 |

OTHER PUBLICATIONS

Liu Xue, The International Searching Authority written comments, Jun. 2014, CN.

* cited by examiner

Primary Examiner — Hung Duong

(57) ABSTRACT

An electronic album includes a housing, and the housing includes a front housing and a rear housing, where the front housing and the rear housing are fixed, and are installable or disassembled. When a component in the electronic album malfunctions, inspection and maintenance can be carried out in time by disassembling the front housing and the rear housing.

7 Claims, 3 Drawing Sheets

ELECTRONIC ALBUM

This application is a National Stage Application of PCT application PCT/CN2013/083742 filed on Sep. 18, 2013, which is based on and claims priority to Chinese patent application 201310423391.3 filed on Sep. 16, 2013. The entirety of each of the above-mentioned applications is hereby incorporated by reference herein in its entirety.

TECHNICAL FIELD

The present disclosure relates to the field of household electrical appliances, and more particularly to an electronic album.

BACKGROUND

People often take pictures using cameras or mobile phones and make prints of the pictures. The prints are placed in a photo frame, a photo album, or other places, thus, the prints in the photo frames or photo albums are convenient to view, and are not easily lost. However, because the pictures in the mobile phones or the cameras are very easy to be deleted, some pictures that people like are difficult to find when the pictures are deleted. Thus, people develop the pictures that they like into prints, and the prints are placed in the photo album or photo frame, thereby avoiding deletion of the pictures. However, large pictures means that the photo album or photo frame are correspondingly large. Additionally, because photo albums or photo frames can only carry a limited number of photos and because it is not convenient to carry the photo albums or photo frames around, the pictures cannot be viewed anytime and anywhere.

Inventor has designed an electronic album that stores the pictures, where the electronic album includes a housing, a display screen that displays the pictures, a circuit board, and a battery. The circuit board and the battery are arranged in the housing. The housing includes a front housing and a rear housing, which are fixed in a hot melt manner.

The above-mentioned electronic album is not published. When the front housing and the rear housing are fixed by the hot melt, the electronic album is not easily disassembled. If a component in the electronic album malfunctions, it is difficult to inspect and maintain the electronic album through disassembling of the front housing and the rear housing.

SUMMARY

The aim of the present disclosure is to provide an electronic album capable of Disassembling a front housing and a rear housing after the front housing and the rear housing are fixed.

An electronic album comprises a housing, where the housing comprises a front housing and a rear housing, where the front housing and the rear housing are fixed, and are installable or disassemble from each other.

Furthermore, the front housing is fixed to the rear housing through a screw which makes the front housing and the rear housing firmly fixed and be installable or disassemble.

Furthermore, a screw hole is arranged at the rear housing, and a screw hole column corresponding to the screw hole is arranged at the front housing, which is a specific method of fixing the front housing to the rear housing through the screw, and avoids the screw hole be found from direction of the front housing, thus, a surface of the front housing is smooth, and the surface of the front housing becomes beautiful.

Furthermore, an adapter sleeve is formed along the screw hole of the rear housing, and the adapter sleeve is configured with threads, and the threads of the adapter sleeve are matches with threads of the screw hole. The adapter sleeve increases contact area between the adapter sleeve and the screw, thus, the front housing is thinly fixed to the rear housing through the screw.

Furthermore, a first depression is disposed at a top portion of the adapter sleeve, and a top portion of the screw hole column is laid in the first depression, which limits movement of the screw hole column, makes the screw easily be fixed, and firmly fixes the front housing to the rear housing through the screw.

Furthermore, a limit platform arranged at the screw hole column, and the top portion of the screw hole column is inserted into the first depression and stops at the limit platform, which avoids damage of the adapter sleeve because of excessive force of inserting the screw hole column into the first depression.

Furthermore, a reinforcing rib is arranged at the screw hole column, which improves strength of the screw hole column.

Furthermore, a height of the reinforcing rib is equal to a height between the limit platform and a bottom of the screw hole column. The height of the reinforcing rib is equal to the height of the limit platform, the reinforcing rib and the limit platform limit the screw hole column together when the top portion of the screw hole column is inserted in the first depression, thereby improving limit efficiency.

Furthermore, a second depression is arranged along the screw hole of the rear housing, and a screw cap corresponding to the screw is laid in the second depression, which make the screw not protrude to an outside of the housing, and avoid damage of the screw.

Furthermore, a flange is arranged at an edge of an inner surface of the front housing, and a placed platform s correspondingly arranged at an inner surface of the rear housing, which makes the front housing be tightly fixed to the rear housing.

In the present disclosure, the housing of the electronic album comprises the front housing and the rear housing, and the front housing and the rear housing are fixed, and are installable or disassemble. When a component in the electronic album malfunctions, inspection and maintenance can be carried out in time by disassembling the front housing and the rear housing.

Legends: 1. front housing; 11. through hole; 12. screw hole column; 13. reinforcing rib; 14. flange; 15. limit platform 2. rear housing; 21. screw hole; 22. adapter sleeve; 23. placed platform; 24. the first depression; 25. second depression; 3. control key; 4. display screen; 5. circuit board; 51. universal serial bus (USB) interface; 6. battery; 100. electronic album.

DETAILED DESCRIPTION

The present disclosure will further be described in detail in accordance with the figures and the exemplary examples.

As shown in FIG. 1-FIG. 5, in the present disclosure, an electronic album 100 comprises a housing comprising a front housing 1 and a rear housing 2, where the front housing 1 and the rear housing 2 are fixed, and are installable or disassembled from each other. When a component in the electronic album malfunctions, inspection and maintenance can be carried out in time by disassembling the front housing 1 and the rear housing 2.

Figure 1:
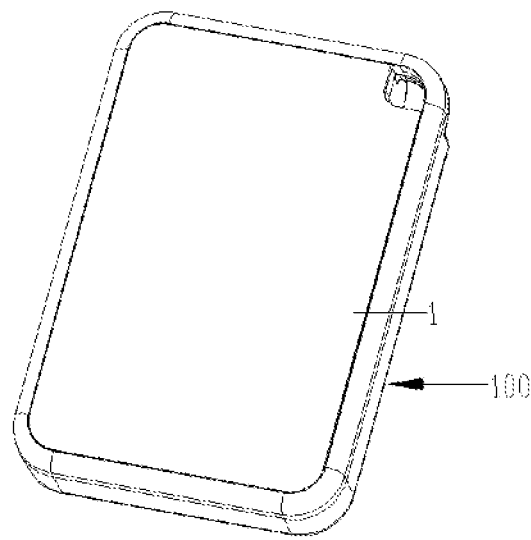
FIG. 1 is a first assembled schematic diagram of an electronic album of an example of the present disclosure.
Figure 2:
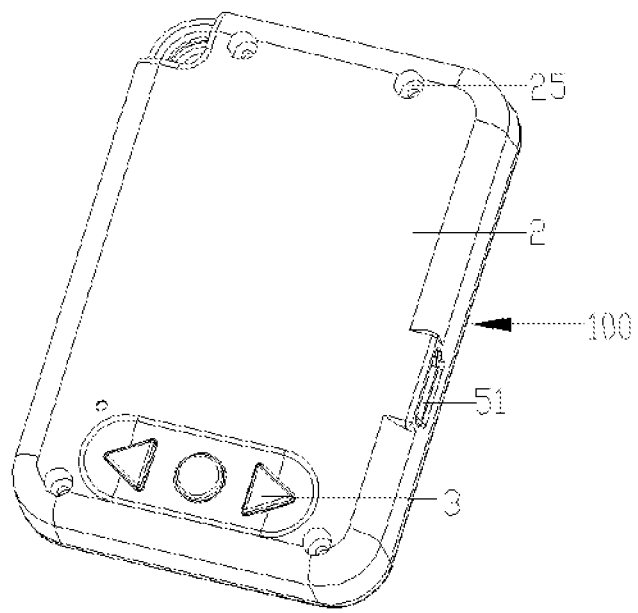
FIG. 2 is a second assembled schematic diagram of the electronic album of the example of the present disclosure.
Figure 3:
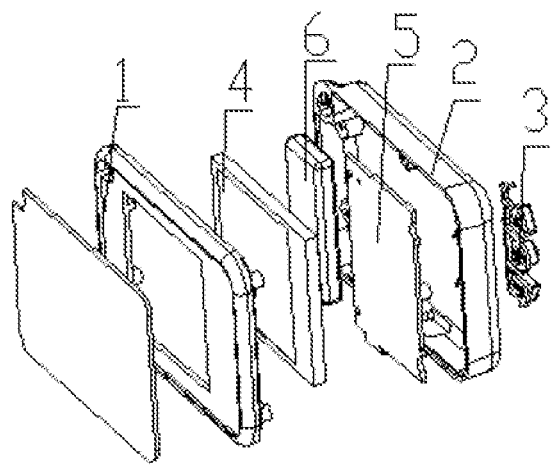
FIG. 3 is an exploded schematic diagram of the electronic album of the example of the present disclosure.
Figure 4:
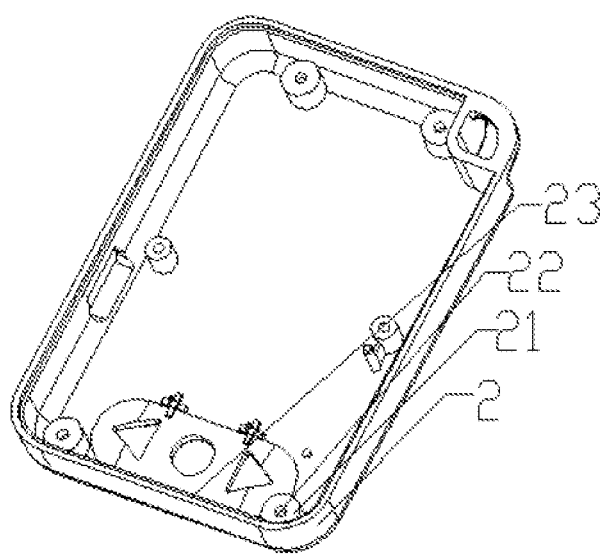
FIG. 4 is a structural diagram of a front housing of the example of the present disclosure.
Figure 5:
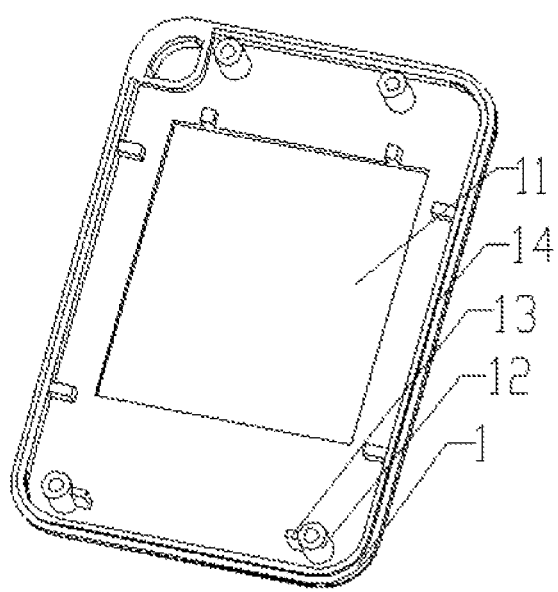
FIG. 5 is a structural diagram of a rear housing of the example of the present disclosure.

As shown in FIG. 2-FIG. 5, the front housing 1 and the rear housing 2 are fixed through a screw, which makes the front housing 1 and the rear housing firmly fixed and be installable or disassemble. If the component in the housing of the electronic album malfunctions, inspection and maintenance can be carried out in time by disassembling the screw that is used to fix the front housing 1 to the rear housing 2. As shown in FIG. 4, a screw hole 21 is arranged at the rear housing 21. As shown in FIG. 5, a screw hole column 12 is correspondingly arranged at an inner surface of the front housing 1, and the screw hole column 12 is matched with the screw hole 21, which avoids the screw hole 21 be found from direction of the front housing 1, thus, a surface of the front housing 1 is smooth, and the surface of the front housing 1 becomes beautiful. The above-mentioned method is a specific method of fixing the front housing 1 to the rear housing 2 though the screw, but it should be understood that other methods can also be used to fix the front housing 1 to the rear housing 2.

As shown in FIG. 4, an adapter sleeve 22 is formed by inwardly Extending along the screw hole 21 arranged on the inner surface of the rear housing 2. The adapter sleeve 22 is configured with threads which matches with threads of the screw hole 21. The adapter sleeve 22 and the threads thereof corresponding to the screw increase contact area between the adapter sleeve 22 and the screw, thus, the front housing 1 is firmly fixed to the rear housing 2 through the screw.

In the example, a first depression 24 is disposed at a top portion of the adapter sleeve 22, and a top portion of the screw hole column 12 is laid in the first depression 2, which limits movement of the screw hole column 12, makes the screw easily be fixed, and firmly fixes the front housing 1 to the rear housing 2 through the screw. It should be understood that, a depression may also be disposed at a top of the screw hole column 12, and a top portion of the adapter sleeve 22 is laid in the depression, which has same effect as the above-mentioned method in the example.

As shown in FIG. 5, a reinforcing rib 13 is arranged at a periphery of the screw hole column 12, where the reinforcing rib is plate-like structure, which improves strength of the screw hole column 12. A limit platform is arranged at a top of the reinforcing rib 13 of the screw hole column 12, and a height between the limit platform 15 and a bottom portion of the screw hole column 12 is equal to a height of the reinforcing rib 13. The top portion of the screw hole column 12 is inserted into the first depression 24 and stops at the limit platform 15, which avoids damage of the adapter sleeve because of excessive force of inserting the screw hole column 12 into the first depression 24. Height of the reinforcing rib 13 is same as height of the limit platform 1, which improves limiting effect of the reinforcing rib 13. The reinforcing rib 13 and the limit platform 15 limit the screw hole column 12 together when the top portion of the screw hole column 12 is inserted in the first depression 21, thereby improving limit efficiency.

In the example, a second depression 25 is arranged on the rear housing along the screw hole 21, and a screw cap corresponding to the screw is laid in the second depression 25, which makes the screw not protrude to an outside of the housing, and avoids damage of the screw. When the screw protrudes to the outside of the housing, the screw easily impacts and scrapes other components, the screw and the electronic album are not only damaged, but also other components are damaged.

In the present disclosure, the front housing 1 is fixed to the rear housing 2 through the screw, the electronic album is easily disassembled, and the fixation of the screw is firm. It should be understood that other detachable fixation methods of firmly fixing the front housing 1 to the rear housing 2 can also be used, such as locking-connecting fixation.

As shown in FIG. 5, a flange 14 is arranged at an edge of the inner surface of the front housing 1. Combined with FIG. 4, a placed platform 23 is correspondingly arranged at the inner surface of the rear housing 2, and the flange 14 is laid on the placed platform 23, which makes the front housing 1 be tightly fixed to the rear housing 2.

As shown in FIG. 3, the electronic album further comprises a display screen 4 that displays pictures, a battery 6 fixed in an inside of the housing, and a circuit board 5. Combined with FIG. 2, a universal serial bus (USB) interface 51 connected to a computer is arranged on the circuit board 5, thus, pictures can be stored in the electronic album through the computer and the USB interface. A dodging hole is arranged at the rear housing 2, the electronic album further comprises a control key 3 matches with the circuit board 5, and keys of the control key 3 are arranged in the dodging hole, thus, the electronic album is easily used. Combined with FIG. 5, a through hole 11 that avoids the display screen 4 is arranged at the front housing, thus, the display screen 4 can easily be viewed via the through hole 11. The electronic album has advantages of small size, portability, and being used anytime and anywhere.

The present disclosure is described in detail in accordance with the above contents with the specific exemplary examples. However, this present disclosure is not limited to the specific examples. For the ordinary technical personnel of the technical field of the present disclosure, on the premise of keeping the conception of, the technical personnel can also make simple deductions or replacements, and all of which should be considered to belong to the protection scope of the present disclosure.

I claim:

1. An electronic album, comprising:
   a housing;
   wherein the housing comprises a front housing and a rear housing, and the front housing is fixed to the rear housing through a screw; a screw hole is arranged at the rear housing, and a screw hole column corresponding to the screw hole is arranged at the front housing; an adapter sleeve is formed along the screw hole of the rear housing, and the adapter sleeve is configured with threads, and the threads of the adapter sleeve matches with threads of the screw hole.

2. The electronic album of claim 1, wherein a first depression is disposed at a top portion of the adapter sleeve, and a top portion of the screw hole column is laid in the first depression.

3. The electronic album of claim 1, wherein a limit platform is arranged at the screw hole column, and the top portion of the screw hole column is inserted into the first depression and stops at the limit platform.

4. The electronic album of claim 1, wherein a reinforcing rib is arranged at the screw hole column.

5. The electronic album of claim 4, wherein a height of the reinforcing rib is equal to a height between the limit platform and a bottom portion of the screw hole column.

6. The electronic album of claim 1, wherein a second depression is arranged at the rear housing along the screw hole, and a screw cap corresponding to the screw is laid in the second depression.

7. The electronic album of claim 1, wherein a flange is arranged at an edge of an inner surface of the front housing, and a placed platform is correspondingly arranged at an inner surface of the rear housing.

* * * * *